(12) United States Patent
Egawa

(10) Patent No.: US 8,451,676 B2
(45) Date of Patent: May 28, 2013

(54) SEMICONDUCTOR DEVICE WITH SIGNAL LINES AND SHIELD LINES

(75) Inventor: Hidekazu Egawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 158 days.

(21) Appl. No.: 12/605,688

(22) Filed: Oct. 26, 2009

(65) Prior Publication Data

US 2010/0103757 A1 Apr. 29, 2010

(30) Foreign Application Priority Data

Oct. 29, 2008 (JP) ................................. 2008-278797

(51) Int. Cl.
G11C 7/02 (2006.01)

(52) U.S. Cl.
USPC ................. 365/206; 365/189.08; 365/185.18; 365/63

(58) Field of Classification Search
USPC .......................... 365/206, 189.08, 185.18, 63
See application file for complete search history.

(56) References Cited

U.S. PATENT DOCUMENTS

| | | | | |
|---|---|---|---|---|
| 5,808,930 | A | * | 9/1998 | Wada et al. ...................... 365/63 |
| 6,147,918 | A | * | 11/2000 | Takashima et al. ........... 365/207 |
| 6,181,620 | B1 | * | 1/2001 | Agata et al. .................... 365/203 |
| 6,664,634 | B2 | | 12/2003 | Thompson et al. |
| 6,754,110 | B2 | * | 6/2004 | Beer et al. ................ 365/189.07 |
| 6,788,561 | B2 | | 9/2004 | Watanabe et al. |
| 6,909,644 | B2 | * | 6/2005 | Fujioka et al. ................ 365/196 |
| 6,947,344 | B2 | * | 9/2005 | Suh ............................... 365/205 |
| 7,940,542 | B2 | * | 5/2011 | Funane et al. ................... 365/51 |
| 2002/0027799 | A1 | * | 3/2002 | Sakata et al. .................. 365/145 |

FOREIGN PATENT DOCUMENTS

| | | |
|---|---|---|
| JP | 2003-007860 A | 1/2003 |
| JP | 2003-007860 A | 10/2003 |
| JP | 2005-332903 A | 12/2005 |

* cited by examiner

*Primary Examiner* — Connie Yoha
(74) *Attorney, Agent, or Firm* — Foley & Lardner LLP

(57) ABSTRACT

A semiconductor device may include, but is not limited to, a first signal line, a second signal line, and a first shield line. The first signal line is supplied with a first signal. The first signal is smaller in amplitude than a potential difference between a power potential and a reference potential. The second signal line is disposed in a first side of the first signal line. The second signal line is supplied with a second signal. The second signal is smaller in amplitude than the potential difference. The first shield line is disposed in a second side of the first signal line. The second side is opposite to the first side. The first shield line reduces a coupling noise that is applied to the first shield line from the second side.

30 Claims, 13 Drawing Sheets

L101T AND L101B EACH RECEIVE NOISES
FROM LOCAL IO LINES ON BOTH SIDES,
BUT NOISES ARE CANCELLED
SINCE L100T AND L100B ARE SIGNALS WITH OPPOSITE PHASES
AND L101T AND L101B ARE SIGNALS WITH OPPOSITE PHASES

# SEMICONDUCTOR DEVICE WITH SIGNAL LINES AND SHIELD LINES

BACKGROUND OF THE INVENTION

1. Field of the Invention

The present invention generally relates to a semiconductor device. More specifically, the present invention relates to a dynamic random access memory, hereinafter referred to as a DRAM.

Priority is claimed on Japanese Patent Application No. 2008-278797, filed Oct. 29, 2008, the content of which is incorporated herein by reference.

2. Description of the Related Art

In semiconductor devices such as DRAMs, local input/output (I/O) lines extend in parallel to each other. The local input/output (I/O) lines are adjacent to each other with a small distance between those. In some cases, four local input/output (I/O) lines are placed side by side. A coupling noise is caused by two adjacent local input/output (I/O) lines. In some cases, a first local input/output (I/O) line may be adjacent to second and third local input/output (I/O) lines. Namely, the first local input/output (I/O) line may be disposed between the second and third local input/output (I/O) lines. In this case, the first local input/output (I/O) line may in general cause coupling noises with the second and third local input/output (I/O) lines. It has been desired to suppress or reduce the coupling noises between two adjacent local input/output (I/O) lines. A typical method of suppressing such a coupling noise has been proposed. There is disposed a shield wiring line which is adjacent to a signal line that receives a coupling noise.

Japanese Unexamined Patent Application, First Publication, No. JP-A-2003-7860 discloses a technique of disposing signal lines, which have an electric potential that is fixed to the power supply potential or ground potential, on both sides.

Japanese Unexamined Patent Application, First Publication, No. JP-A-2005-332903 discloses a technique of disposing wiring lines, which have a predetermined fixed electric potential during a period for which a coupling noise is received, on both sides.

SUMMARY

In one embodiment, a semiconductor device may include, but is not limited to, a first signal line, a second signal line, and a first shield line. The first signal line is supplied with a first signal. The first signal is smaller in amplitude than a potential difference between a power potential and a reference potential. The second signal line is disposed in a first side of the first signal line. The second signal line is supplied with a second signal. The second signal is smaller in amplitude than the potential difference. The first shield line is disposed in a second side of the first signal line. The second side is opposite to the first side. The first shield line reduces a coupling noise that is applied to the first shield line from the second side.

In another embodiment, a semiconductor device may include, but is not limited to, a plurality of signal lines and at least one line. The plurality of signal lines extends substantially in parallel to each other. The plurality of signal lines is given signals that are smaller in amplitude than a potential difference between a power potential and a ground potential. The at least one line is maintained at a fixed potential. The at least one line is disposed in an opposite side of one of the signal lines to a side in which another of the signal lines is disposed.

In still another embodiment, a semiconductor device may include, but is not limited to, a plurality of signal lines and at least one shield line. The plurality of signal lines extends substantially in parallel to each other. The plurality of signal lines is given signals that are smaller in amplitude than a potential difference between a power potential and a reference potential. The at least one shield line is maintained at a fixed potential. Each of the plurality of signal lines is disposed between adjacent another of the plurality of signal lines and any one of the at least one shield line and a signal-line-free area. The signal-line-free area is free of the others of the plurality of signal lines and also free of any signal line which is given a signal that is smaller in amplitude than the potential difference.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIGS. 8, 9, 10, 13, and 14, in order to facilitate the understanding of the present invention.

Figure 8:
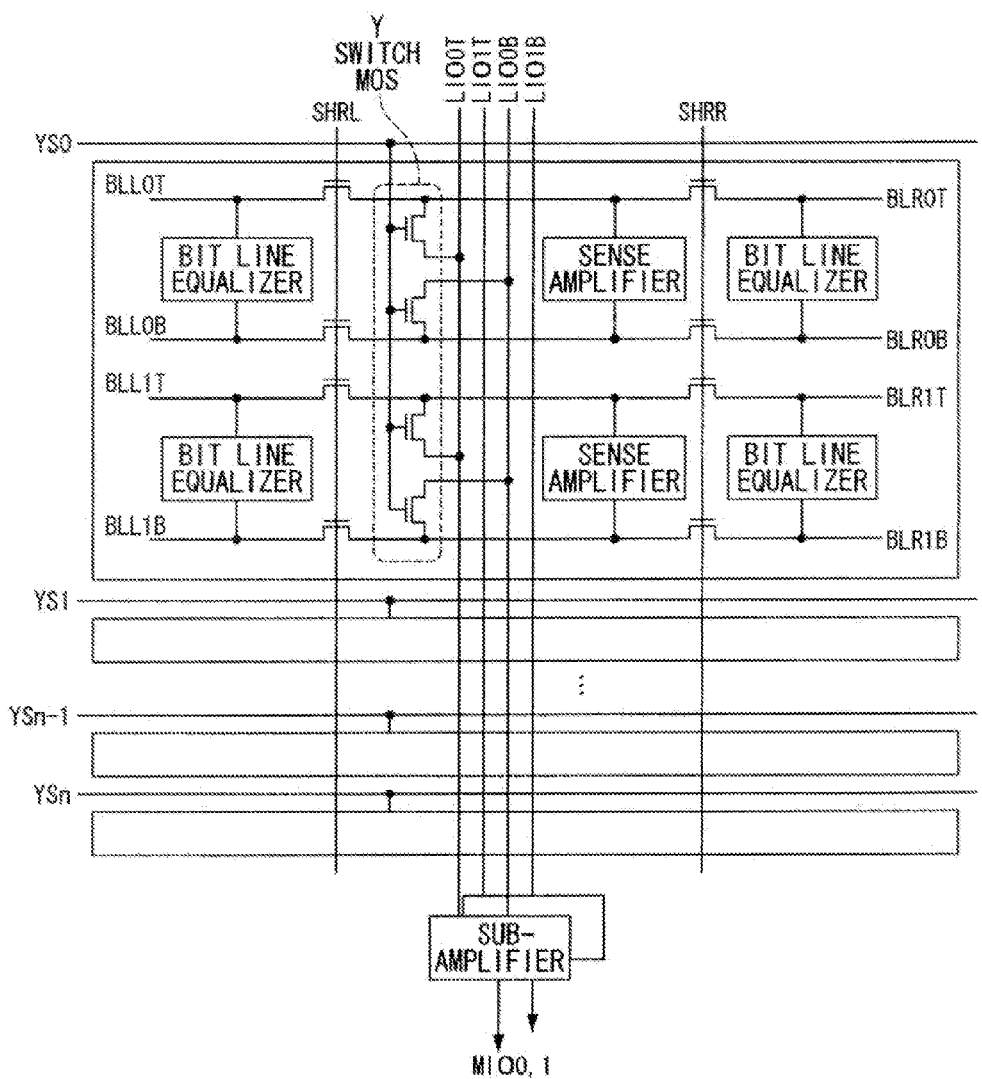
FIG. 8 is a diagram illustrating a sense amplifier region of the DRAM which adopts the folded bit line architecture in the related art.

In known DRAMs, a folded bit line architecture has been adopted for memory cells and bit lines. FIG. 8 is a diagram illustrating a sense amplifier region of the DRAM which adopts the folded bit line architecture in the related art. Each true bit line BLL0T and each bar bit line BLL0B shown in FIG. 8 are disposed in parallel, and the bit lines are disposed on the same side with respect to a sense amplifier. Here, the sense amplifier is shared between two left and right bit line pairs (bit line BLL0T, bit line BLL0B) and (bit line BLR0T, bit line BLR0B) which interpose the sense amplifier between them. To amplify a small signal from a memory cell connected to either one of the bit line pairs with the sense amplifier, the left and right bit line pairs are separated from the sense amplifier by shared signals SHRL and SHRR, respectively.

In addition, a sense amplifier and a local input/output (I/O) line are connected to each other by a Y switch signal. Two sets of bit line pairs (bit line BLL0T, bit line BLL0B) and (bit line BLL1T, bit line BLL1B) or two sets of bit line pairs (bit line BLR0T, bit line BLR0B) and (bit line BLR1T, bit line BLR1B) are connected to local input/output (I/O) line pairs (local input/output (I/O) line LIO0T, local input/output (I/O) line LIO0B) and (local input/output (I/O) line LIO1T, local input/output (I/O) line LIO1B) by a Y switch MOS to which a Y switch signal YS0 is input. Here, the local input/output (I/O) lines are disposed in a direction perpendicular to the bit lines. In addition, the difference potential between the local input/output (I/O) line pairs is amplified by two sub-amplifiers shown in FIG. 8, and the data obtained as a result of the amplification is transmitted to the outside of the memory cell array by main IO lines MIO0 and MIO1.

Figure 9:
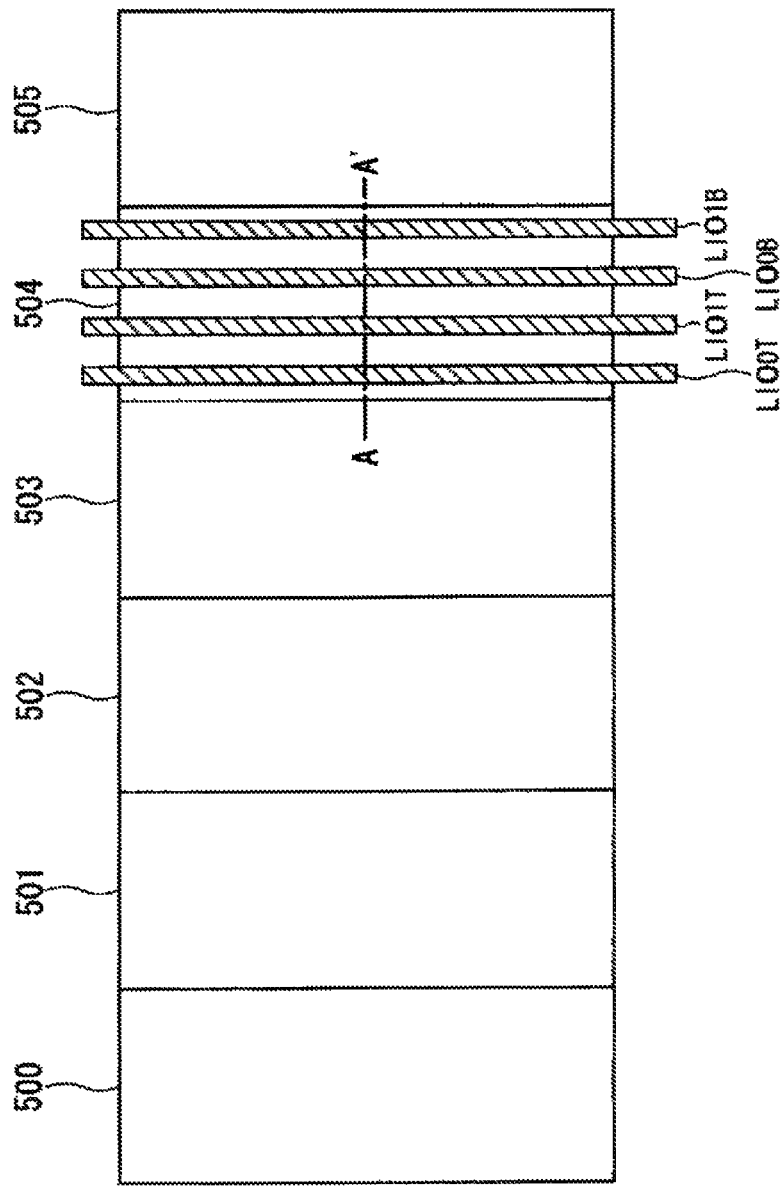
FIG. 9 is a schematic view illustrating the layout of the circuit configurations of FIG. 8.

FIG. 9 is a schematic view illustrating the layout of the circuit configurations of FIG. 8.

Each region in FIG. 9 is a region where the arrangement of an MOS transistor is conceptually illustrated, and corresponds to the schematic view illustrating the sense amplifier region in FIG. 8. That is, corresponding to FIG. 8, regions of a bit line equalizing MOS arrangement region 500, a sense amplifier PMOS arrangement region 501, a sense amplifier control MOS arrangement region 502, a sense amplifier NMOS arrangement region 503, a Y switch MOS arrangement region 504, and a bit line equalizing MOS arrangement region 505 are disposed from the left.

Here, four local input/output (I/O) lines are disposed in parallel in the Y switch MOS arrangement region 504. Moreover, by this arrangement method, local input/output (I/O) lines adjacent to the local input/output (I/O) line LIO1T are two of the local input/output (I/O) line LIO0T and the local input/output (I/O) line LIO0B, for example. However, since signals with the opposite phases are transmitted through the local input/output (I/O) line LIO0T and the local input/output (I/O) line LIO0B, coupling noises that have an effect on the local input/output (I/O) line LIO1T disposed between the two local input/output (I/O) lines are cancelled.

Figure 10:
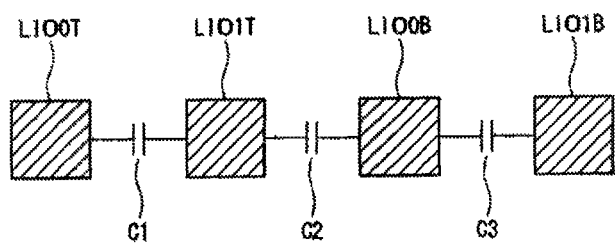
FIG. 10 is a schematic view illustrating the floating capacitances generated between local input/output (I/O) lines when the local input/output (I/O) lines are cut in a direction perpendicular to the longitudinal direction along the line AA' of FIG. 9.

FIG. 10 is a schematic view illustrating the floating capacitances generated between local input/output (I/O) lines when the local input/output (I/O) lines are cut in a direction perpendicular to the longitudinal direction along the line AA' of FIG. 9. Here, the floating capacitances generated between the local input/output (I/O) lines are denoted as floating capacitance C1, floating capacitance C2, and floating capacitance C3. If the distance between local input/output (I/O) lines decreases as the mounting density of wiring lines increases, the floating capacitance between the local input/output (I/O) lines increases. This causes a problem of coupling noise, and it is also disadvantageous in raising the speed of the DRAM.

In addition, the problem of coupling noise becomes more noticeable when the open bit line method is adopted for memory cells and bit lines.

Figure 13:
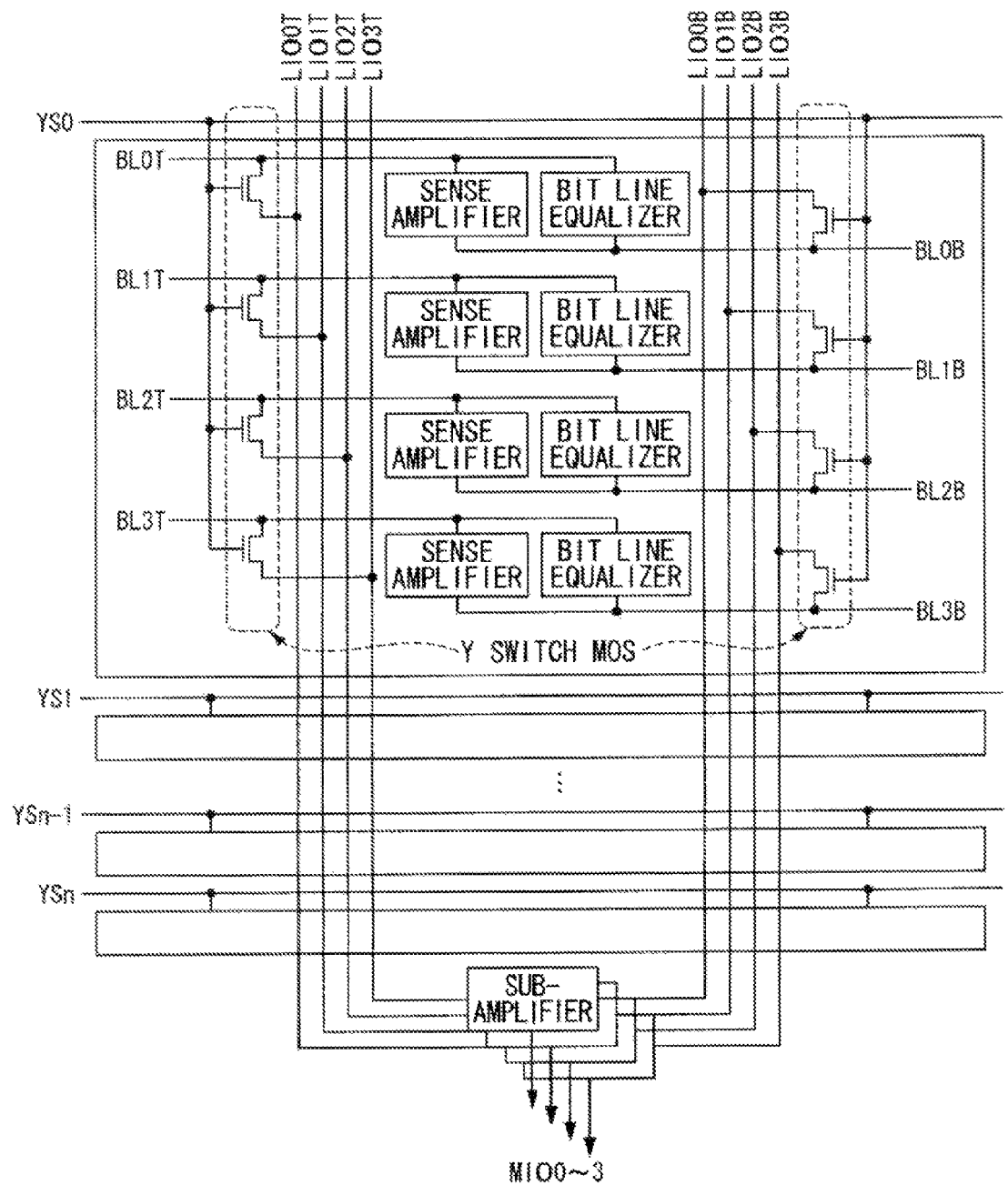
FIG. 13 is a schematic view illustrating the sense amplifier region when the open bit line method is adopted.

In accordance with the open bit line method, each true bit line and each bar bit line are disposed in opposite sides with respect to a sense amplifier interposed between them. FIG. 13 is a schematic view illustrating the sense amplifier region when the open bit line method is adopted. In FIG. 13, in order to make the bit number of a DRAM memory cell equal to that in the folded bit line architecture shown in FIG. 8 described previously, the following configurations are adopted. The bit line pairs are four pairs, for example, the first pair of bit line BL0T and bit line BL0B, the second pair of bit line BL1T and bit line BL1B, the third pair of bit line BL2T and bit line BL2B, and the fourth pair of line bit BL3T and bit line BL3B. The local input/output (I/O) line pairs are four pairs, for example, the first pair of local input/output (I/O) line LIO0T and local input/output (I/O) line LIO0B, the second pair of local input/output (I/O) line LIO0T and local input/output (I/O) line LIO0B, the first pair of local input/output (I/O) line LIO2T and local input/output (I/O) line LIO2B, and the fourth pair of local input/output (I/O) line LIO0T and local input/output (I/O) line LIO3B.

Figure 14:
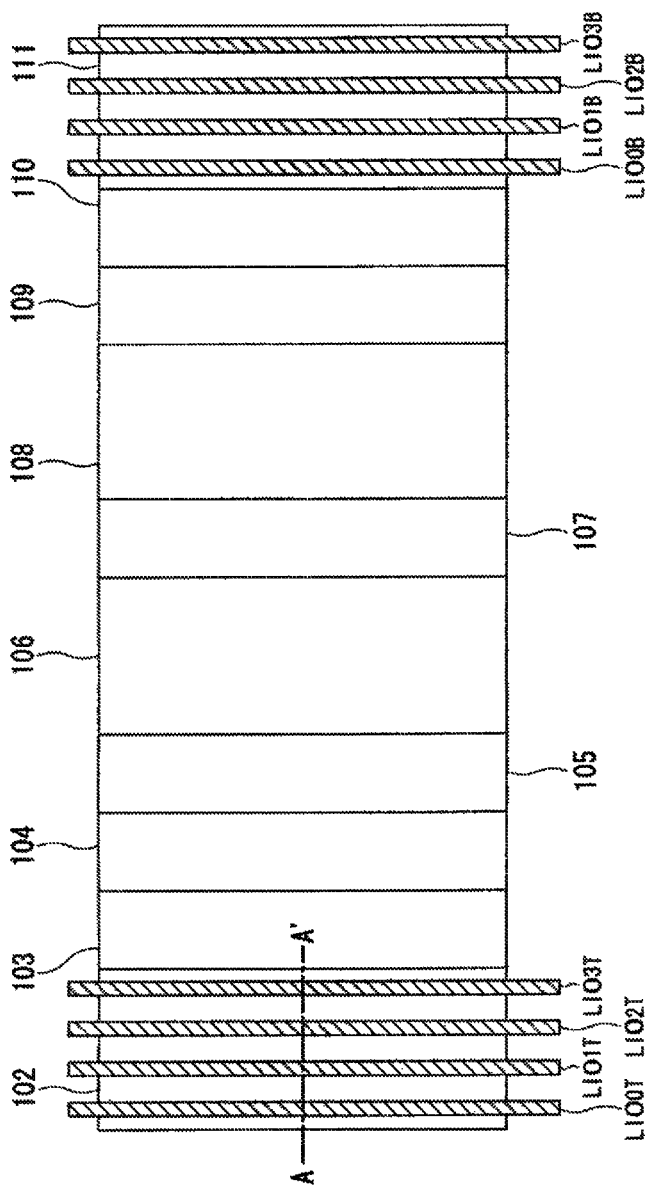
FIG. 14 is a schematic view illustrating the circuit configurations of FIG. 13.

FIG. 14 is a schematic view illustrating the circuit configurations of FIG. 13. As shown in FIG. 14, a Y switch MOS arrangement region 102, a bit line equalizing NMOS arrangement region 103, a sense amplifier NMOS arrangement region 104, a bit line equalizing PMOS arrangement region 105, a sense amplifier PMOS arrangement region 106, a bit line equalizing PMOS arrangement region 107, a sense amplifier control MOS arrangement region 108, a sense amplifier NMOS arrangement region 109, a bit line equalizing NMOS arrangement region 110, and a Y switch MOS arrangement region 111 are disposed from the left. In accordance with the open bit line method, the Y switch MOS arrangement regions 102 and 111 need to be separated as true and bar and be disposed at the positions closest to bit lines. Accordingly, for the local input/output (I/O) lines, four true and four bars are disposed in parallel in the Y switch MOS arrangement region.

The open bit line method is similar to the known folded bit line architecture in that four local input/output (I/O) lines are disposed in parallel. However, for the two inside local input/output (I/O) lines, if signals on local input/output (I/O) lines located at both sides thereof are not signals with opposite phases, the amount of coupling noise increases compared with that in the related art. For example, when signals with an opposite phase are transmitted through both the local input/output (I/O) line LIO0T and the local input/output (I/O) line LIO2T which are adjacent to the local input/output (I/O) line LIO1T, the local input/output (I/O) line LIO1T receives a coupling noise from the local input/output (I/O) lines located at both the sides. As a result, the amount of signal is reduced.

If wiring lines having an electric potential fixed to the power supply potential or ground potential or signal lines having a predetermined fixed electric potential during the period for which a coupling noise is received are disposed on both sides of all wiring lines, which are disposed at extremely narrow distances like local input/output (I/O) lines of the DRAM, so as to be adjacent to wiring lines that receive noises as described above, the wiring region is increased and accordingly, the area of the entire DRAM chip is increased. This is against the high integration.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

In one embodiment, a semiconductor device may include, but is not limited to, a first signal line, a second signal line, and a first shield line. The first signal line is supplied with a first signal. The first signal is smaller in amplitude than a potential difference between a power potential and a reference potential. The second signal line is disposed in a first side of the first signal line. The second signal line is supplied with a second signal. The second signal is smaller in amplitude than the potential difference. The first shield line is disposed in a second side of the first signal line. The second side is opposite to the first side. The first shield line reduces a coupling noise that is applied to the first shield line from the second side. The first shield line prevents the first signal line from receiving a coupling noise from the second side of the first signal line, wherein the second side is opposite to the first side in which the second signal line is disposed. This arrangement does not need a pair of shield lines are disposed both sides of each of the signal lines. Namely, this arrangement does not need a large number of shield lines.

In another embodiment, a semiconductor device may include, but is not limited to, a plurality of signal lines and at least one line. The plurality of signal lines extends substantially in parallel to each other. The plurality of signal lines is given signals that are smaller in amplitude than a potential difference between a power potential and a ground potential. The at least one line is maintained at a fixed potential. The at least one line is disposed in an opposite side of one of the signal lines to a side in which another of the signal lines is disposed. The shield line prevents the signal line from receiving a coupling noise from the second side of the signal line, wherein the second side is opposite to the first side in which the second signal line is disposed. This arrangement does not need a pair of shield lines are disposed both sides of each of the signal lines. Namely, this arrangement does not need a large number of shield lines.

In still another embodiment, a semiconductor device may include, but is not limited to, a plurality of signal lines and at least one shield line. The plurality of signal lines extends substantially in parallel to each other. The plurality of signal lines is given signals that are smaller in amplitude than a potential difference between a power potential and a reference potential. The at least one shield line is maintained at a fixed potential. Each of the plurality of signal lines is disposed between adjacent another of the plurality of signal lines and any one of the at least one shield line and a signal-line-free area. The signal-line-free area is free of the others of the plurality of signal lines and also free of any signal line which is given a signal that is smaller in amplitude than the potential difference. The shield line prevents the signal line from receiving a coupling noise from the second side of the signal line, wherein the second side is opposite to the first side in which the second signal line is disposed. This arrangement does not need a pair of shield lines are disposed both sides of each of the signal lines. Namely, this arrangement does not need a large number of shield lines.

First Embodiment

Figure 1:
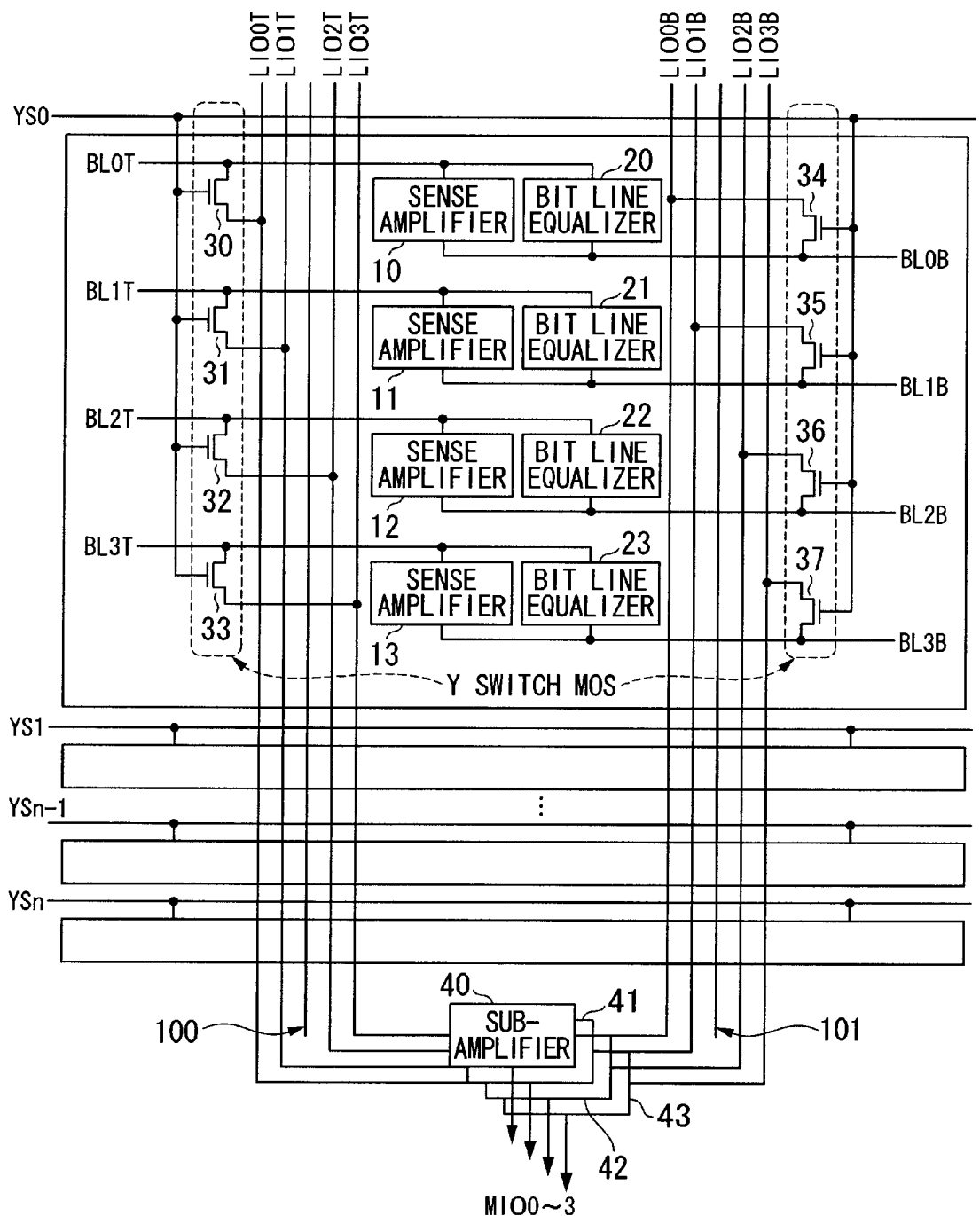
FIG. 1 is a schematic view illustrating the sense amplifier region of a DRAM when the open bit line method is adopted in accordance with a first preferred embodiment of the present invention.

FIG. 1 is a schematic view illustrating the sense amplifier region of a DRAM when the open bit line method is adopted. In accordance with the open bit line method, each true bit line and each bar bit line are disposed in opposite sides with respect to a sense amplifier interposed between them. In FIG. 1, true bit lines BL0T, BL1T, BL2T, and BL3T are disposed on the left sides of sense amplifiers, and bar bit lines BL0B, BL1B, BL2B, and BL3B are disposed on the right sides of the sense amplifiers, respectively. The true bit lines and the bar bit lines form pairs and are connected to sense amplifier 10, 11, 12, and 13, respectively.

Each sense amplifier serves to amplify the difference potential generated between the bit lines of the bit line pair after signals are output from memory cells to the bit lines after selection of a word line. In addition, since the bit lines of each bit line pair need to have the same electric potential before the selection of the word line, the bit lines of each bit line pair are maintained to have the same electric potential by bit line equalizers 20, 21, 22, and 23. At the point of time when the difference potential is generated between the bit lines of each bit line pair by a sense amplifier control MOS circuit (not shown) after activation of the sense amplifier, the bit line pairs are electrically connected to local input/output (I/O) line pairs by Y switch MOSs 30, 31, 32, 33, 34, 35, 36, and 37 controlled by a Y switch signal YS0. In FIG. 1, the four bit line pairs are connected to four local input/output (I/O) line pairs. The first pair of bit line BL0T and bit line BL0B are connected to the first pair of local input/output (I/O) line LIO0T and local input/output (I/O) line LIO0B. The second pair of bit line BL1T and bit line BL1B are connected to the second pair of local input/output (I/O) line LIO1T and local input/output (I/O) line LIO1B. The third pair of bit line BL2T and bit line BL2B are connected to the third pair of local input/output (I/O) line LIO2T and local input/output (I/O) line LIO2B. The fourth pair of bit line BL3T and bit line BL3 are connected to the fourth pair of local input/output (I/O) line LIO3T and local input/output (I/O) line LIO3B. In addition, bit line pairs not shown are connected to the corresponding local input/output (I/O) line pairs through respective Y switch MOSs not shown. These bit line pairs are amplified by corresponding sense amplifiers not shown, but the bit line pairs are not electrically connected to the respective local input/output (I/O) line pairs because Y switch signals YS1, YSn−1, and YSn are not selected.

The local input/output (I/O) line pairs are disposed in a direction perpendicular to the bit lines. The difference potentials between the local input/output (I/O) lines of the local input/output (I/O) line pairs are amplified by four sub-amplifiers 40, 41, 42, and 43 shown in FIG. 1. The data is transmitted to the outside of the memory cell array as main IO lines MIO0, MIO1, MIO2, and MIO3.

This embodiment is different from the related art. A power supply line 100 is disposed between the local input/output (I/O) lines LIO1T and LIO2T, which are two inside local input/output (I/O) lines of the four local input/output (I/O) lines, in parallel with the local input/output (I/O) lines. A power supply line 101 is disposed between the local input/output (I/O) lines LIO1B and LIO2B, which are two inside local input/output (I/O) lines of the four local input/output (I/O) lines, in parallel with the local input/output (I/O) lines.

Figure 2:
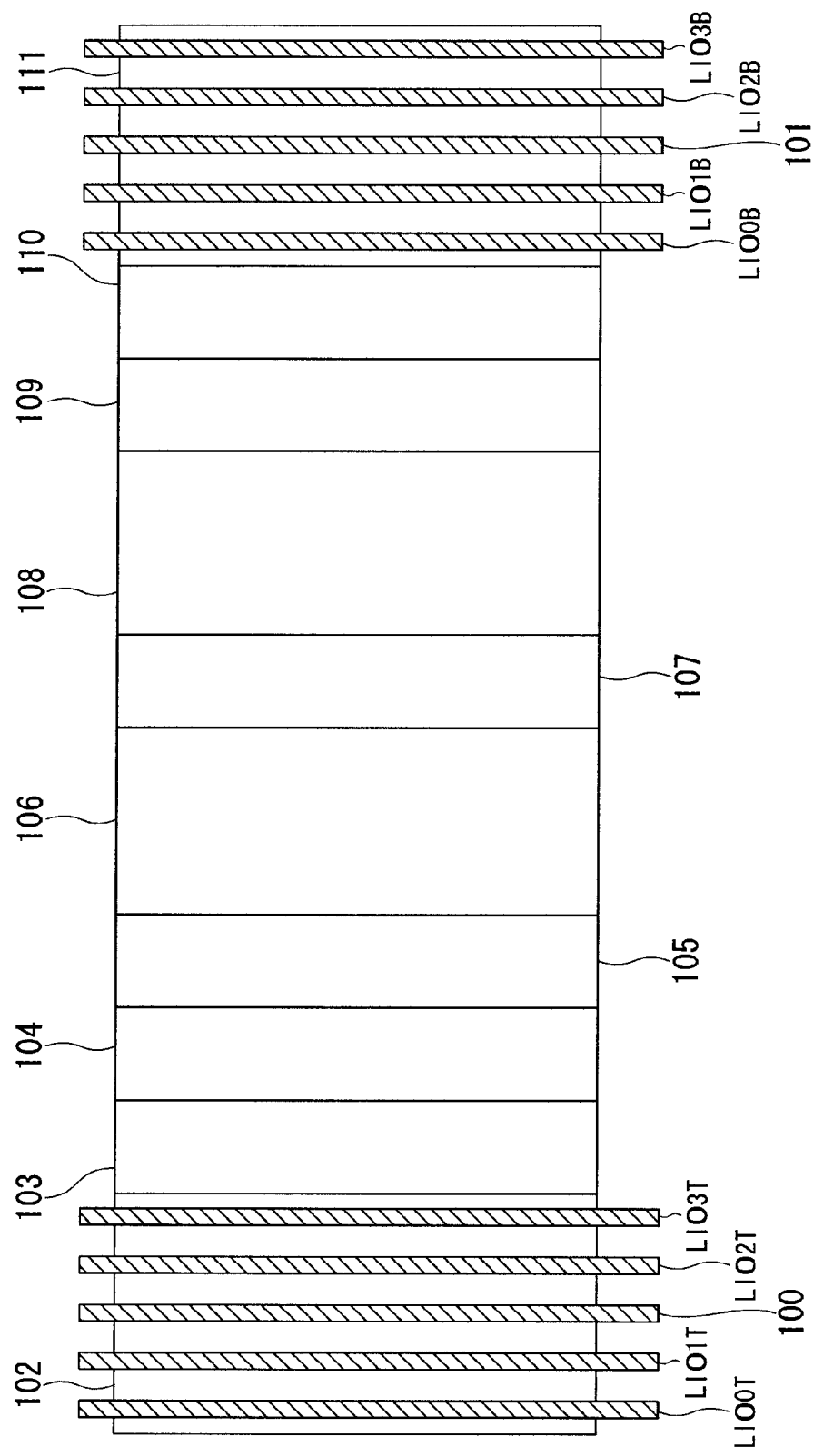
FIG. 2 is a schematic view illustrating the sense amplifier region layout of the circuit configuration of FIG. 1.

FIG. 2 is a schematic view illustrating the sense amplifier region layout of the circuit configuration of FIG. 1. Each region shown in FIG. 2 is a region of a MOS transistor existing between a true bit line and a bar bit line. Here, a Y switch MOS arrangement region 102, a Y switch MOS arrangement region 111, a bit line equalizing NMOS arrangement region 103, a bit line equalizing NMOS arrangement region 110, a sense amplifier NMOS arrangement region 104, and a sense amplifier NMOS arrangement region 109 are disposed at true or bar side so that the bit line capacitances of true bit line and bar bit line are not unbalanced. The true side has the Y switch MOS arrangement region 102, the bit line equalizing NMOS arrangement region 103, the sense amplifier NMOS arrangement region 104. The bar side has the Y switch MOS arrangement region 111, the bit line equalizing NMOS arrangement region 110, and the sense amplifier NMOS arrangement region 109. In addition, in order to reduce the separation region between an NMOS and a PMOS so that the width of the sense amplifier region has no increase. A bit line equalizing PMOS arrangement region 105, a bit line equalizing PMOS arrangement region 107, and a sense amplifier PMOS arrangement region 106 are gathered in the middle of the region. Moreover, for a sense amplifier control MOS arrangement region 108, the PMOS region is disposed on the true side and the NMOS region is disposed on the bar side when both the PMOS and the NMOS are used.

Moreover, for the local input/output (I/O) lines, local input/output (I/O) lines LIO0T, LIO1T, LIO2T, and LIO3T are disposed in the Y switch MOS arrangement region close to the true bit line, and local input/output (I/O) lines LIO0B, LIO1B, LIO2B, and LIO3B are disposed in the Y switch MOS arrangement region close to the bar bit line.

In the present embodiment, the power supply line 100 is disposed between the true side local input/output (I/O) lines LIO1T and LIO2T in parallel with the local input/output (I/O) lines, and the power supply line 101 is disposed between the bar side local input/output (I/O) lines LIO1B and LIO2B in parallel with the local input/output (I/O) lines.

Figure 3:
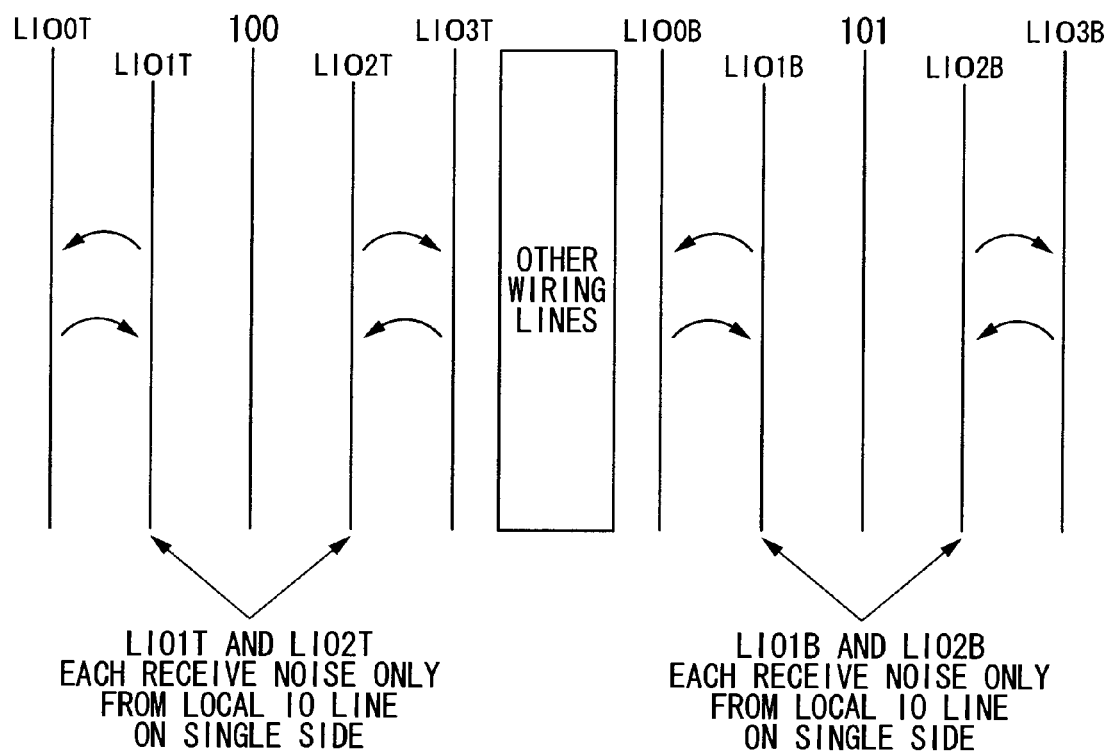
FIG. 3 is a schematic view illustrating the direction in which a change in the electric potential occurs due to a coupling noise generated between local input/output (I/O) lines.

FIG. 3 is a schematic view illustrating the direction in which a change in the electric potential occurs due to a coupling noise generated between local input/output (I/O) lines. A local input/output (I/O) line as a source of noise generation and a local input/output (I/O) line which receives a noise are shown by arrows. For example, the local input/output (I/O) line LIO0T receives a noise from the local input/output (I/O) line LIO1T, and the local input/output (I/O) line LIO1T receives a noise from the LIO0T on the contrary. On the other hand, the local input/output (I/O) line LIO1T does not receive a coupling noise from the local input/output (I/O) line LIO2T because a change in the electric potential of the local input/output (I/O) line LIO2T is shielded by the power supply line 100. Similarly, the local input/output (I/O) line LIO2T does not receive a coupling noise from the local input/output (I/O) line LIO1T due to the power supply line 100. Also on the bar side, the local input/output (I/O) lines LIO1B and LIO2B do not receive coupling noises from each other due to the power supply line 101.

This situation is shown in FIGS. 4A to 4D in more detail. In this example, there are four local input/output (I/O) line pairs. Accordingly, there are in total 16 combinations as the combination of LIO0T, LIO1T, LIO2T, and LIO3T of data of the local input/output (I/O) lines. The data of the local input/output (I/O) lines LIO2T and LIO3T are set to be 0 and 1, respectively, for the sake of convenience of later comparison with a known example.

Explanations on the bar side local input/output (I/O) lines LIO0B, LIO1B, LIO2B, and LIO3B will be omitted since signals on the bar side local input/output (I/O) lines have opposite phases to those of the true side local input/output (I/O) lines.

In FIGS. 4A to 4D, the electric potential VI indicates an electric potential of each local input/output (I/O) line before the local input/output (I/O) line is connected to the sense amplifier. Moreover, VL and VH indicate low and high levels of an electric potential of each local input/output (I/O) line to reach when the sub-amplifier is activated, respectively, after the local input/output (I/O) line is connected to the sense amplifier. In addition, the arrows in FIGS. 4A to 4D indicate a change in the electric potential of each local input/output (I/O) line. The arrow shown by a one-dotted chain line indicates an electric potential change (change from VI to VL or VH) when a coupling noise is not received, and the arrow shown by a solid line indicates an actual change in the electric potential.

Figure 4A:
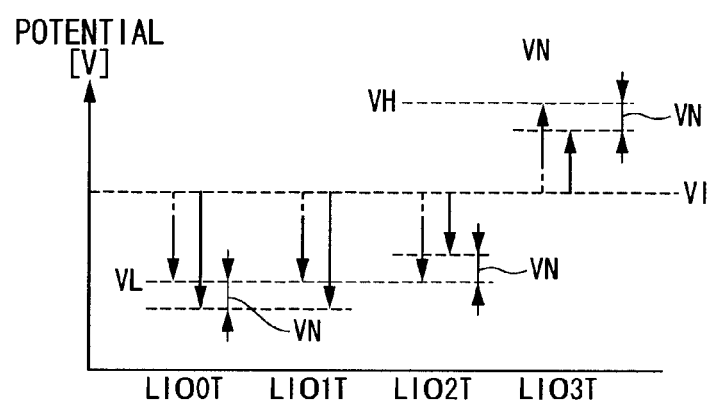
FIGS. 4A through 4D are diagrams illustrating potentials of four local input/output (I/O) lines.

When the combination of data of local input/output (I/O) lines is (0, 0, 0, 1) as shown in FIG. 4A, the electric potential of the local input/output (I/O) line LIO0T located at the outermost side of the four local input/output (I/O) lines is changed to an electric potential lower than VL due to the floating capacitance C1 between the local input/output (I/O) line LIO0T and the local input/output (I/O) line LIO1T located next to the local input/output (I/O) line LIO0T inwardly. The difference between the electric potential and VL is a coupling noise VN. Similarly, the electric potential of the local input/output (I/O) line LIO1T is changed to an electric potential lower than VL by VN due to the floating capacitance C1 between the local input/output (I/O) lines LIO0T and LIO1T.

In this case, the local input/output (I/O) line LIO1T does not receive a coupling noise from the local input/output (I/O) line LIO2T due to the power supply line 100 and receives only a coupling noise from the local input/output (I/O) line LIO0T.

On the other hand, for the local input/output (I/O) lines LIO2T and LIO3T, the directions of electric potential changes are opposite to those described above. Accordingly, the electric potential of the local input/output (I/O) line LIO2T is changed to an electric potential higher than VL by VN, and the electric potential of the local input/output (I/O) line LIO3T is changed to an electric potential lower than VH by VN. Similarly, the local input/output (I/O) line LIO2T does not receive a coupling noise from the local input/output (I/O) line LIO1T due to the power supply line 100.

Figure 4B:
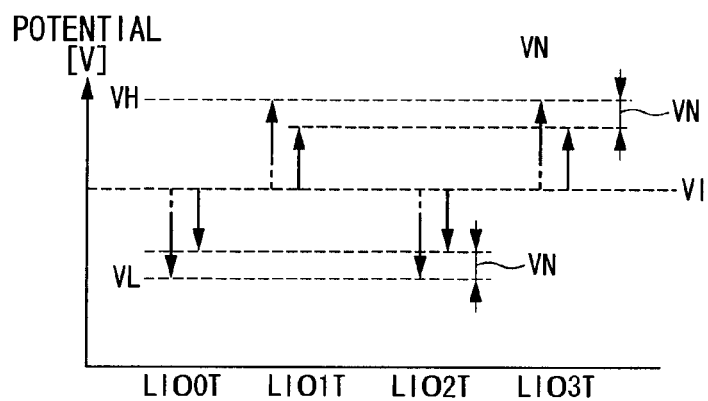

When the combination of data of local input/output (I/O) lines is (0, 1, 0, 1) as shown in FIG. 4B, the electric potentials of the local input/output (I/O) lines LIO0T and LIO1T are changed similar to those of the local input/output (I/O) lines LIO2T and LIO3T when the combination is (0, 0, 0, 1). That is, the electric potential of the local input/output (I/O) line LIO0T is changed to an electric potential higher than VL by VN, and the electric potential of the local input/output (I/O) line LIO1T is changed to an electric potential lower than VH by VN.

Figure 4C:
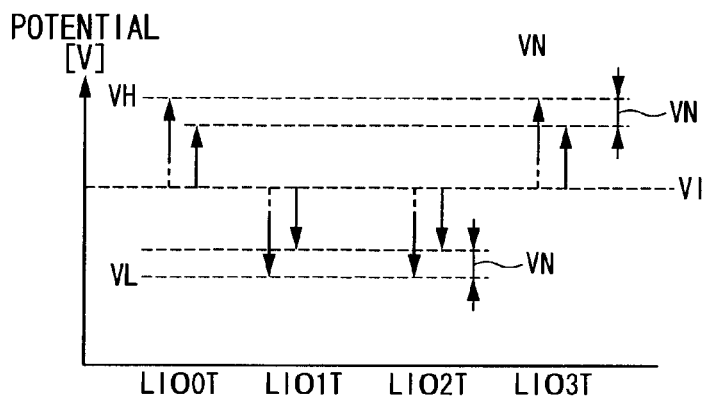
Figure 4D:
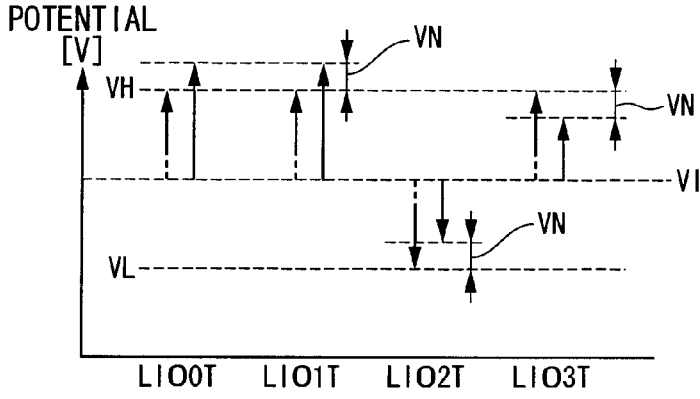

When the combination of data of local input/output (I/O) lines is (1, 0, 0, 1) as FIG. 4C, the electric potentials of the local input/output (I/O) lines LIO0T and LIO3T are changed to electric potentials lower than VH by VN, and the electric potentials of the local input/output (I/O) lines LIO1T and LIO2T are changed to electric potentials higher than VL by VN. In addition, when the combination of data of local input/output (I/O) lines is (1, 1, 0, 1), the local input/output (I/O) lines LIO0T and LIO1T are in the complementary relationship. Accordingly, the electric potentials of the local input/output (I/O) lines LIO0T and LIO1T are changed to values higher than VH by VN as FIG. 4D.

Next, comparison with a coupling noise in the open bit line method as shown FIG. 14 when the power supply lines 100 and 101 do not exist will be performed.

Figure 15:
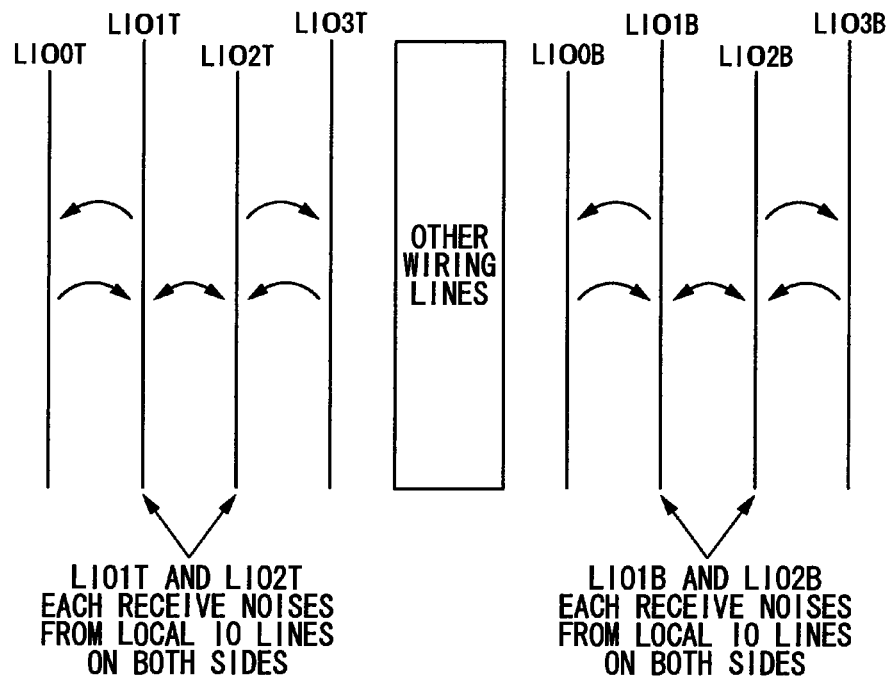
FIG. 15 is a schematic view illustrating a coupling noise generated between local input/output (I/O) lines when there is no power supply line.

FIG. 15 is a schematic view illustrating a coupling noise generated between local input/output (I/O) lines when there is no power supply line. FIG. 15 is similar to FIG. 3 in that a local input/output (I/O) line as a source of noise generation and a local input/output (I/O) line which receives a noise are shown by arrows. In FIG. 15, however, the relationship in which each of adjacent local input/output (I/O) lines is a noise source and also receives a noise is additionally shown by a double-pointed arrow. For example, the local input/output (I/O) line LIO1T gives a coupling noise to the local input/output (I/O) line LIO2T and also receives a coupling noise from the LIO2T.

Figure 16:
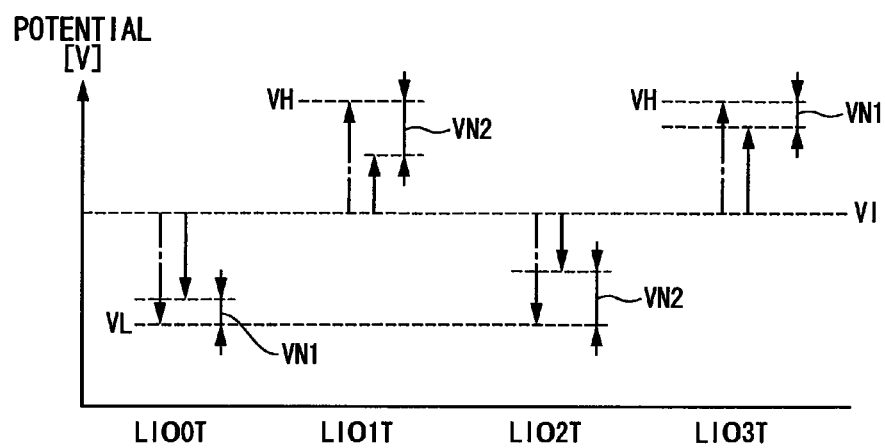
FIG. 16 shows a change in the electric potential of each local input/output (I/O) line when (0, 1, 0, 1) is adopted as the data combination of (LIO0T, LIO1T, LIO2T, LIO3T).

FIG. 16 shows a change in the electric potential of each local input/output (I/O) line when (0, 1, 0, 1) is adopted as the data combination of (LIO0T, LIO1T, LIO2T, LIO3T).

In addition, an explanation on the bar side local input/output (I/O) lines LIO0B, LIO1B, LIO2B, and LIO3B will be omitted since signals on the bar side local input/output (I/O) lines have opposite phases to those of the true side local input/output (I/O) lines. Similar to the above-described case, the electric potential of each local input/output (I/O) line is assumed to be VI immediately before the local input/output (I/O) line is connected to a sense amplifier, and the electric potentials VL and VH indicate low and high levels of an electric potential to reach when the sub-amplifier is activated, respectively, after the local input/output (I/O) line is connected to the sense amplifier. In this combination, the local input/output (I/O) line LIO0T located at the outer side among the four local input/output (I/O) lines receives a coupling noise VN1 due to the local input/output (I/O) line LIO1T located next to the local input/output (I/O) line LIO0T inwardly, and the local input/output (I/O) line LIO3T located at the outer side among the four local input/output (I/O) lines receives a coupling noise VN1 due to the local input/output (I/O) line LIO2T located next to the local input/output (I/O) line LIO3T inwardly.

On the other hand, the local input/output (I/O) line LIO1T located next to the local input/output (I/O) line LIO0T inwardly receives a coupling noise VN2 because the electric potentials of the adjacent local input/output (I/O) lines LIO0T and LIO2T are changed to VL even though the electric potential of the local input/output (I/O) line LIO1T is changed to VH. When the values of VN1 and VN2 are compared with the previous amount of change VN, the coupling noise VN1 is almost equal to VN and the coupling noise VN2 is twice the coupling noise VN assuming that the distances between local input/output (I/O) lines and the wiring lengths of the local input/output (I/O) lines are equal.

Accordingly, by disposing the power supply line 100 between the local input/output (I/O) lines LIO1T and LIO2T, the local input/output (I/O) line LIO1T does not receive a coupling noise from the local input/output (I/O) lines, which are located at both sides of the local input/output (I/O) line LIO1T, any more. As a result, the amount of coupling noise can be greatly reduced.

Next, the case where it is compared with the folded bit line architecture (FIG. 9) will be described.

Figure 11:
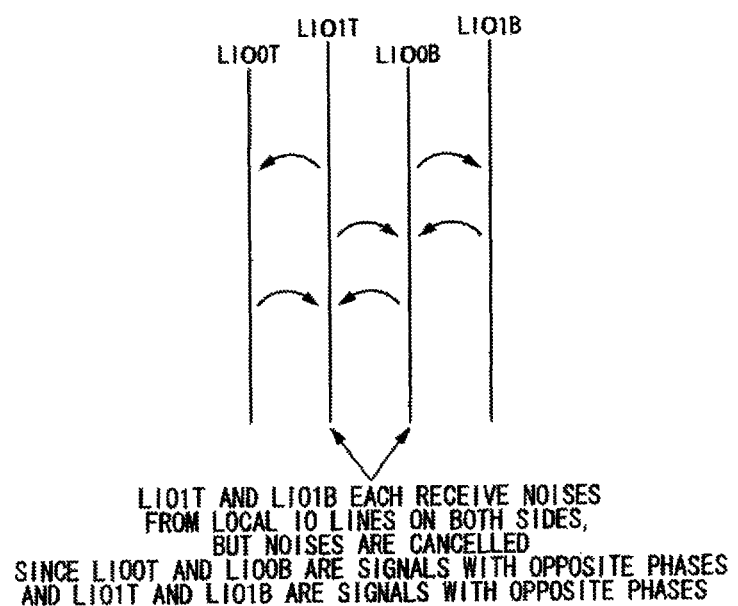
FIG. 11 is a schematic view illustrating a coupling noise generated between local input/output (I/O) lines.

FIG. 11 is a schematic view illustrating a coupling noise generated between local input/output (I/O) lines.

The point that a local input/output (I/O) line as a source of noise generation and a local input/output (I/O) line which receives a noise are shown by arrows is the same as that described above. In addition, a change in the electric potential of each local input/output (I/O) line is shown in FIGS. 12A to 12D. In FIGS. 12A to 12D, VI indicates the electric potential of each local input/output (I/O) line is VI immediately before the local input/output (I/O) line is connected to a sense amplifier, and VL and VH indicate low and high levels of an electric potential to reach when the sub-amplifier is activated, respectively, after the local input/output (I/O) line is connected to the sense amplifier. In this example, there are two pairs of local input/output (I/O) lines. Accordingly, there are four combinations that can be set when (LIO0, LIO1) are considered as the combination of data.

Figure 12A:
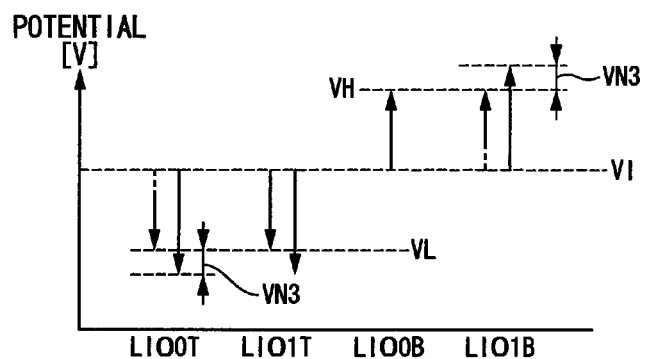
FIGS. 12A through 12D are diagrams illustrating potentials of four local input/output (I/O) lines.

When the combination of data of local input/output (I/O) lines is (0, 0) as shown in FIG. 12A, the electric potential of the local input/output (I/O) line LIO0T located at the outermost side of the four local input/output (I/O) lines is changed to an electric potential lower than VL due to the floating capacitance C1 between the local input/output (I/O) line LIO0T and the local input/output (I/O) line located next to the local input/output (I/O) line LIO0T inwardly. The difference between the electric potential and VL is a coupling noise VN3. Similarly, the electric potential of the outside local input/output (I/O) line LIO1B is changed to an electric potential higher than VH by VN3 due to the local input/output (I/O) line LIO0B, which is located next to the local input/output (I/O) line LIO1B inwardly, and the floating capacitance C3.

Figure 12B:
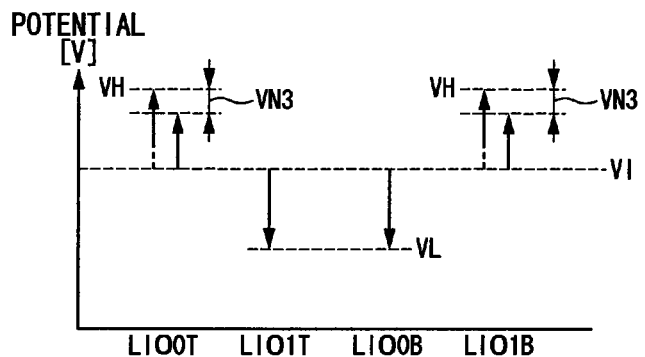

On the other hand, when the combination of data of local input/output (I/O) lines is (1, 0) as shown in FIG. 12B, each of the local input/output (I/O) lines LIO0T and LIO1B located at the outer sides receives a coupling noise from the local input/output (I/O) line located next to each of the local input/output (I/O) lines LIO0T and LIO1B inwardly in a direction in which the amount of signal is decreased.

Figure 12C:
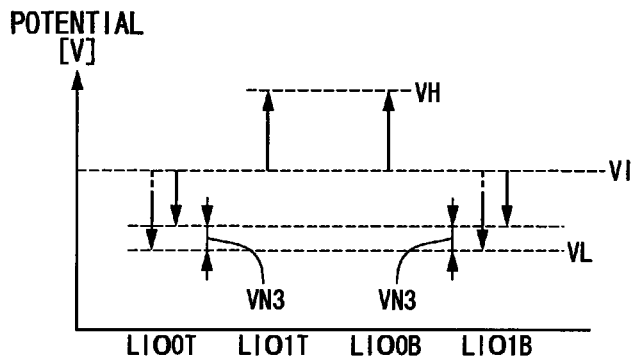
Figure 12D:
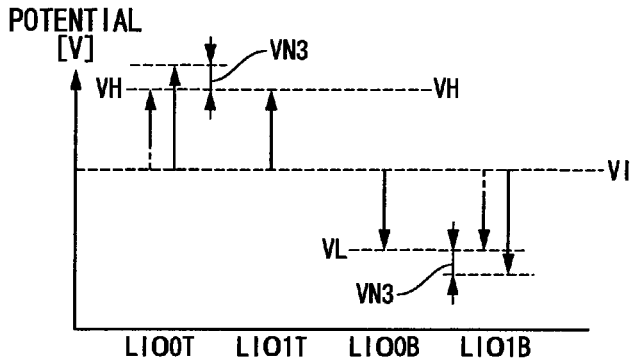

Similarly, when the combination of data of local input/output (I/O) lines is (0, 1), a coupling noise is received in a direction in which the amount of signal is decreased as shown in FIG. 12C. In addition, when the combination of data of local input/output (I/O) lines is (1, 1), a coupling noise is received in a direction in which the amount of signal is increased as shown in FIG. 12D.

Therefore, in the folded bit line architecture, when the combination of data of local input/output (I/O) lines is different in the local input/output (I/O) lines LIO0T and LIO1T, a coupling noise is received in a direction in which the amount of signal is decreased.

Assuming that the local input/output (I/O) lines and the wiring lengths are equal for comparison with the embodiment, VN3 is almost equal to VN.

Thus, according to the semiconductor device of the present embodiment, a plurality of signal lines includes a first set of local input/output (I/O) lines LIO0T, LIO1T, LIO2T, and LIO3T and a second set of local input/output (I/O) lines LIO0B, LIO1B, LIO2B, and LIO3B. The local input/output (I/O) lines are disposed in parallel to each other. Signals are transmitted through each of the local input/output (I/O) lines. The signals may have amplitude that is smaller than the signal amplitudes corresponding to the power supply potential and the ground potential. Wiring lines, for example, power supply lines 100 and 101 are provided which maintain a predetermined electric potential. The wiring lines, for example, the power supply lines 100 and 101 are provided at only one side where the signal lines such as the local input/output (I/O) lines LIO1T and LIO1B are opposite to the other signal lines such as local input/output (I/O) lines LIO2T and LIO2B.

As a result, the signal line such as the local input/output (I/O) line LIO1T receives only a coupling noise from the adjacent signal line such as the local input/output (I/O) line LIO0T. In addition, the signal lines such as the local input/output (I/O) lines LIO2T, LIO1B, and LIO2B receive only coupling noises from one side or from the signal lines such as the local input/output (I/O) lines LIO3T, LIO0B, and LIO3B which are adjacent to the signal lines (local input/output (I/O) lines LIO2T, LIO1B, and LIO2B), respectively. Namely, the local input/output (I/O) line LIO2T receives only a coupling noise from the local input/output (I/O) line LIO3T which is adjacent to the local input/output (I/O) line LIO2T. The local input/output (I/O) line LIO1B receives only a coupling noise from the local input/output (I/O) line LIO0B which is adjacent to the local input/output (I/O) line LIO1B. The local input/output (I/O) line LIO2B receives only a coupling noise from the local input/output (I/O) line LIO3B which is adjacent to the local input/output (I/O) line LIO2B. Thus, the signal line such as the local input/output (I/O) line does not receive a coupling noise from signal lines such as the local input/output (I/O) lines on both sides of the signal line, which are adjacent to the signal line. Accordingly, the amount of coupling noise can be suppressed to almost the same as that when the above-described folded dead bit line method is adopted. As a result, a DRAM capable of realizing the high speed can be obtained. In addition, since it is not necessary to provide a power supply line between all local input/output (I/O) lines, it is possible to prevent an increase in the chip area caused by an increase in the area of a wiring region.

Furthermore, in the above-described embodiment, the power supply line is disposed between the local input/output (I/O) lines LIO1T and LIO2T, which are two inside local input/output (I/O) lines of the four parallel local input/output (I/O) lines, and between the local input/output (I/O) lines LIO1B and LIO2B, which are two inside local input/output (I/O) lines of the four parallel local input/output (I/O) lines. However, the same effect can be obtained even if the power supply is disposed between the local input/output (I/O) lines LIO0T and LIO1T, between the local input/output (I/O) lines LIO2T and LIO3T, between the local input/output (I/O) lines LIO0B and LIO1B, and between the local input/output (I/O) lines LIO2B and LIO3B.

In this case, the signal line such as the local input/output (I/O) line LIO1T receives only a coupling noise from the adjacent signal line such as the local input/output (I/O) line LIO2T. In addition, the signal lines such as the local input/output (I/O) lines LIO2T, LIO1B, and LIO2B receive only coupling noises from one side or from the signal lines such as the local input/output (I/O) lines LIO1T, LIO2B, and LIO1B which are adjacent to the signal lines such as the local input/output (I/O) lines LIO2T, LIO1B, and LIO2B, respectively. Namely, the local input/output (I/O) line LIO2T receives only a coupling noise from the local input/output (I/O) line LIO1T which is adjacent to the local input/output (I/O) line LIO2T. The local input/output (I/O) line LIO1B receives only a coupling noise from the local input/output (I/O) line LIO2B which is adjacent to the local input/output (I/O) line LIO1B. The local input/output (I/O) line LIO2B receives only a coupling noise from the local input/output (I/O) line LIO1B which is adjacent to the local input/output (I/O) line LIO2B. Accordingly, similarly, a signal line such as the local input/output (I/O) line does not receive a coupling noise from signal lines such as the local input/output (I/O) lines on both sides of the signal line, which are adjacent to the signal line.

Second Embodiment

Figure 5:
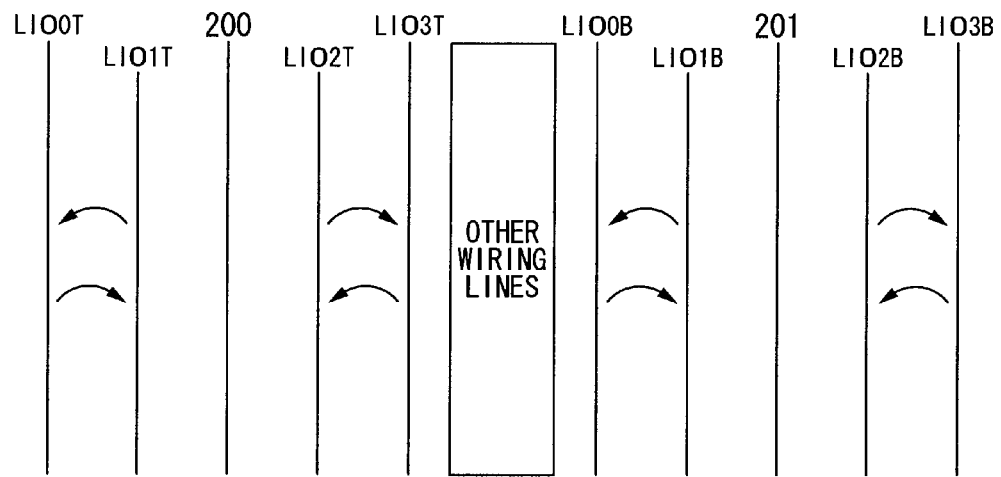
FIG. 5 is a schematic view illustrating a coupling noise generated between local input/output (I/O) lines in a second embodiment of the invention.

FIG. 5 is a schematic view illustrating a coupling noise generated between local input/output (I/O) lines in a second embodiment of the invention. The different of the second embodiment from the first embodiment is that the power supply lines 100 and 101 in the first embodiment are replaced with signal lines 200 and 201. Any signal line may be used as the signal lines 200 and 201 as long as it is not a signal line activated during a period for which a small signal is transmitted to a local input/output (I/O) line. It may be a fixed electric potential of a ground potential, a power supply potential, or an intermediate electric potential between two electric potentials. In the present embodiment, the disposed signal lines 200 and 201 show the effect as shield wiring lines like the power supply lines 100 and 101. In addition, the signal lines 200 and 201 may be used in the sense amplifier region or may be used for a signal simply passing through the sense amplifier region. Accordingly, signal wiring lines can be effectively used.

Third Embodiment

Figure 6:
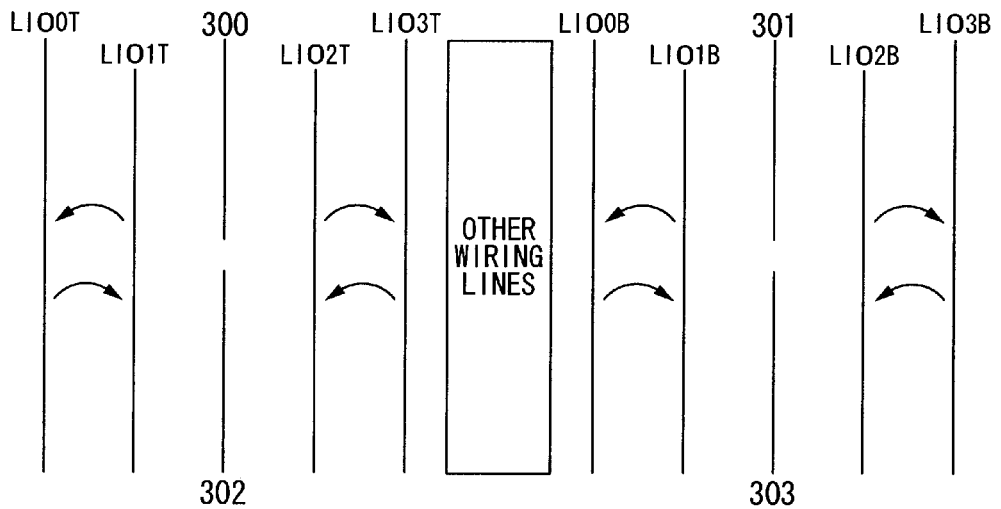
FIG. 6 is a schematic view illustrating a coupling noise generated between local input/output (I/O) lines in a third embodiment of the invention.

FIG. 6 is a schematic view illustrating a coupling noise generated between local input/output (I/O) lines in a third embodiment of the invention. While one kind of power supply line has been used in the first embodiment, two different power supply lines are disposed in the present embodiment. First and second power supply lines 300 and 302 are disposed between local input/output (I/O) lines LIO1T and LIO2T, and first and second power supply lines 301 and 303 are disposed between local input/output (I/O) lines LIO1B and LIO2B. According to the present embodiment, since the electric potentials of the first and second power supply lines are fixed electric potentials, the effect as shield wiring lines is obtained. In addition, the present embodiment is particularly effective in the case where power supply lines with the different electric potentials are needed in a sense amplifier region.

Fourth Embodiment

Figure 7:
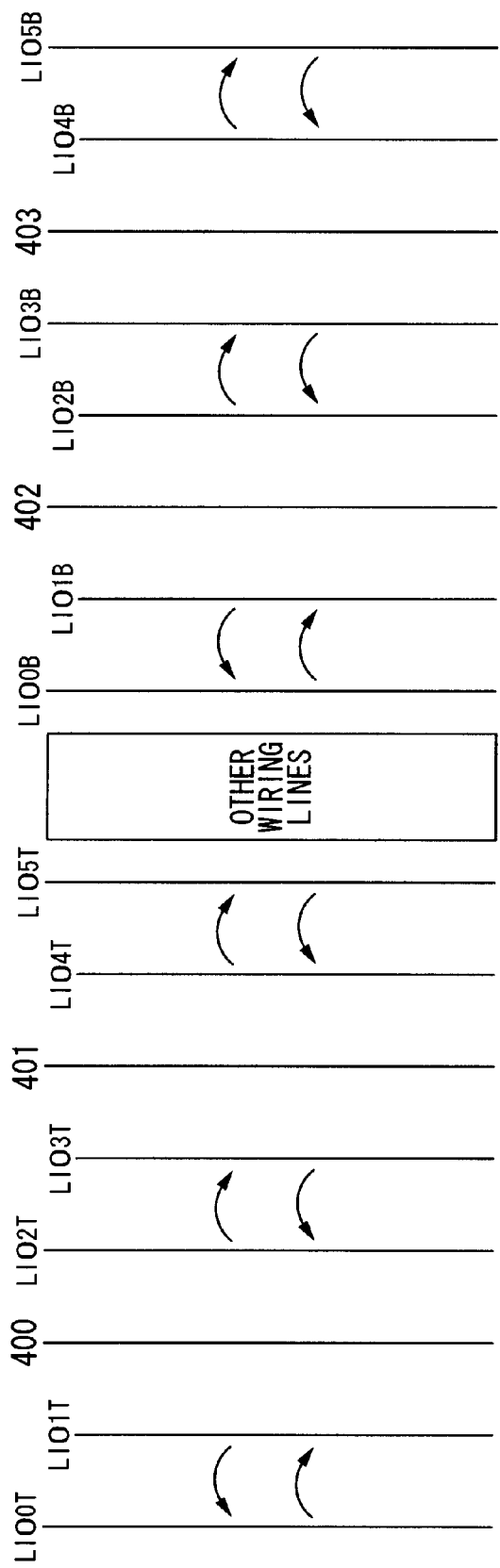
FIG. 7 is a schematic view illustrating a coupling noise generated between local input/output (I/O) lines in a fourth embodiment of the invention.

FIG. 7 is a schematic view illustrating a coupling noise generated between local input/output (I/O) lines in a fourth embodiment of the invention. FIG. 7 shows the case as follows. There are provided six local input/output (I/O) line pairs. The first pair of the local input/output (I/O) line pairs are local input/output (I/O) line LIO0T and local input/output (I/O) line LIO0B. The second pair of the local input/output (I/O) line pairs are local input/output (I/O) line LIO1T and local input/output (I/O) line LIO1B. The third pair of the local input/output (I/O) line pairs are local input/output (I/O) line LIO2T and local input/output (I/O) line LIO2B. The fourth pair of the local input/output (I/O) line pairs are local input/output (I/O) line LIO3T and local input/output (I/O) line LIO3B. The fifth pair of the local input/output (I/O) line pairs are local input/output (I/O) line LIO4T and local input/output (I/O) line LIO4B. The sixth pair of the local input/output (I/O) line pairs are local input/output (I/O) line LIO0T and local input/output (I/O) line LIO0B.

It does not need to be limited to the above number, and it is a number to be appropriately determined according to the number of local input/output (I/O) lines of a DRAM or the like. That is, when the number of local input/output (I/O) line pairs is five or more, a power supply line is disposed for every two local input/output (I/O) lines and the power supply line is disposed on only the one side for all of the local input/output (I/O) lines in the embodiment. FIG. 7 shows the case where the number of local input/output (I/O) line pairs is six. In this case, for six local input/output (I/O) lines existing on the true side, a power supply line 400 is disposed between the second and third local input/output (I/O) lines LIO1T and LIO2T and a power supply line 401 is disposed between the fourth and fifth local input/output (I/O) lines LIO3T and LIO4T. On the other hand, for six local input/output (I/O) lines existing on the bar side, a power supply line 402 is disposed between the second and third local input/output (I/O) lines LIO1B and LIO2B and a power supply line 403 is disposed between the fourth and fifth local input/output (I/O) lines LIO3B and LIO4B. Accordingly, the local input/output (I/O) lines which interpose a power supply line therebetween do not receive coupling noises from each other. According to the present embodiment, even if the number of local input/output (I/O) line increases, it is not necessary to dispose the shield wiring lines adjacent to all local input/output (I/O) lines. Therefore, a significant increase in the wiring region does not occur. As a result, it is possible to prevent an increase in the chip area caused by an increase in the number of local input/output (I/O) lines. In addition, although the example where the power supply line is disposed has been described in the present embodiment, a signal line with a fixed electric potential during a period for which a local input/output (I/O) line receives a coupling noise may be disposed like the other embodiments described above, or it is also possible to dispose two or more kinds of power supply lines. In addition, these may be appropriately combined.

It is apparent that the present invention is not limited to the above embodiments, but may be modified and changed without departing from the scope and spirit of the invention.

What is claimed is:

1. A semiconductor device comprising:
   a first signal line being supplied with a first signal;
   a second signal line being disposed in a first side of the first signal line, the second signal line being supplied with a second signal;
   a first shield line being disposed in a second side of the first signal line, the second side being opposite to the first side;
   a first sub-amplifying circuit coupled to the first signal line; and
   a second sub-amplifying circuit coupled to the second signal line,
   wherein the first signal line couples to a first bit line via a first switching transistor, and the second signal line couples to a second bit line via a second switching transistor.

2. The semiconductor device according to claim 1, further comprising:
   a first bit line coupled to a plurality of first memory cells;
   a second bit line coupled to a plurality of second memory cells;
   a first sense amplifying circuit coupled to the first bit line to amplify a signal of the first bit line;
   a second sense amplifying circuit coupled to the second bit line to amplify a signal of the second bit line;
   first and second switching transistors coupled between the first and second bit lines and the first and second signal lines, respectively.

3. The semiconductor device according to claim 2, wherein a control terminal of the first switching transistor and a control terminal of the second switching transistor are connected to a control signal line in common.

4. The semiconductor device according to claim 1, further comprising:
   a second shield line substantially parallel to the first and second signal lines and the first shield line, the second shield line being adjacent to the second signal line,
   wherein the second signal line is disposed between the first signal line and the second shield line.

5. The semiconductor device according to claim 1, wherein a distance between the first and second signal lines is equal to a distance between the first and the first shield line.

6. The semiconductor device according to claim 1, wherein a space between the first signal line and the first shield line is free of any signal line.

7. The semiconductor device according to claim 1, wherein the first and second signal lines and the first shield line are same width.

8. The semiconductor device according to claim 1, wherein the second signal line is substantially parallel to the first signal line, the second signal line is adjacent to the first signal line, the first shield line is substantially parallel to the first and second signal lines, and the first shield line is adjacent to the first signal line.

9. The semiconductor device according to claim 1, wherein the first shield line is maintained at a fixed potential at least a period of time when the first signal line receives a coupling noise from the second signal line.

10. A semiconductor device comprising:
    a first signal line being supplied with a first signal;
    a second signal line being disposed in a first side of the first signal line, the second signal line being supplied with a second signal;
    a first shield line being disposed in a second side of the first signal line, the second side being opposite to the first side;
    a third signal line being supplied with a third signal;
    a fourth signal line being disposed in a third side of the third signal line, the fourth signal line being supplied with a fourth signal; and
    a second shield line disposed in a fourth side attic third signal line, the third side being opposite to the fourth side;
    wherein a distance between the first and second shield line is larger than a distance between the first signal line and the first shield line.

11. The semiconductor device according to claim 10, wherein a distance between the first and second signal lines is equal to a distance between the first signal line and the first shield line.

12. The semiconductor device according to claim 10, wherein the first signal line couples to a first bit line via a first switching transistor, the second signal line couples to a second bit line via a second switching transistor, the third signal line coupled to a third bit line via a third switching transistor, and the fourth signal line coupled to a fourth bit line via a fourth switching transistor.

13. The semiconductor device according to claim 10, wherein each of spaces between the first signal line and the first shield line, between the first signal line and the second signal line, between the third signal line and the second shield line, and between the third signal line and fourth signal line is free of any signal line.

14. The semiconductor device according claim 10, wherein the third signal of the third signal line is an inverted signal of the first signal of the first signal line, and the fourth signal line is an inverted signal of the second signal of the second signal line.

15. The semiconductor device according to claim 10, wherein the first, second, third and fourth signal lines and the first and second shield lines are same width.

16. The semiconductor device according to claim 10, wherein the first shield line, the second shield line, the first signal line, the second signal line, the third signal line and the fourth signal line arc arranged in a same wiring layer.

17. A semiconductor device comprising:
    a first signal line elongated in a first direction to transfer a first signal;
    a second signal line arranged in parallel to the first signal line to transfer a second signal, and arranged a first distance from the first signal line, a space between the first signal line and the second signal line being free of any signal line;
    a third signal line arranged in parallel to the second signal line to transfer a third signal, and arranged a second distance from the second signal line, the second distance being larger than the first distance, a space between the second signal line and the third signal line being free of any signal line; and a fourth signal line arranged in parallel to the third signal line to transfer a fourth signal, and arranged a third distance from the third signal line, a space between the third signal line and the fourth signal line being free of any signal line;

wherein the first, second, third and fourth signal lines are arranged in this order.

18. The semiconductor device according to claim 17, further comprising:

first, second, third, and fourth amplifying circuits coupled to the first signal line, the second signal line, the third signal line, and the fourth signal line, respectively.

19. The semiconductor device according to claim 17, further comprising:

a first bit line coupled to a plurality of first memory cells;
a second bit line coupled to a plurality of second memory cells;
a third bit line coupled to a plurality of third memory cells;
a fourth bit line coupled to a plurality of fourth memory cells;
a first sense amplifying circuit coupled to the first hit line to amplify a signal of the first bit line;
a second sense amplifying circuit coupled to the second bit line to amplify a signal of the second bit line;
a third sense amplifying circuit coupled to the second hit line to amplify a signal of the third bit line;
a fourth sense amplifying circuit coupled to the fourth bit line to amplify a signal of the fourth bit line; and
first, second, third, and fourth switching transistors coupled between the first, second, third, and fourth bit lines and the first, second, third, and fourth signal lines, respectively.

20. The semiconductor device according to claim 19, wherein a control terminal of the first switching transistor, a control terminal of the second switching transistor, a control terminal of the third switching transistor, and a control terminal. of the fourth switching transistor arc connected to a control signal line in common.

21. The semiconductor device according to claim 19, wherein the first and third distances is same distance.

22. A semiconductor device comprising:

a first signal line being supplied with a first signal;
a second signal line being disposed in a first side of the first signal line, the second signal line being supplied with a second signal;
a first shield line being disposed in a second side of the first signal line, the second side being opposite to the first side;
a first sub-amplifying circuit coupled to the first signal line; and
a second sub-amplifying circuit coupled to the second signal line,
wherein the first shield line comprises at least one of a power line, a ground line, and a signal line that is maintained at a fixed potential.

23. The semiconductor device according to claim 22, further comprising:

a first bit line coupled to a plurality of first memory cells;
a second bit line coupled to a plurality of second memory cells;
a first sense amplifying circuit coupled to the first bit line to amplify a signal of the first bit line;
a second sense amplifying circuit coupled to the second bit line to amplify a signal of the second bit line;
first and second switching transistors coupled between the first and second bit lines and the first and second signal lines, respectively.

24. The semiconductor device according to claim 23, wherein a control terminal of the first switching transistor and a control terminal of the second switching transistor are connected to a control signal line in common.

25. The semiconductor device according to claim 22, further comprising:

a second shield line substantially parallel to the first and second signal lines and the first shield line, the second shield line being adjacent to the second signal line,
wherein the second signal line is disposed between the first signal line and the second shield line.

26. The semiconductor device according to claim 22, wherein a distance between the first and second signal lines is equal to a distance between the first and the first shield line.

27. The semiconductor device according to claim 22, wherein a space between the first signal line and the first shield line is free of any signal line.

28. The semiconductor device according to claim 22, wherein the first and second signal lines and the first shield line are same width.

29. The semiconductor device according to claim 22, wherein the second signal line is substantially parallel to the first signal line, the second signal line is adjacent to the first signal line, the first shield line is substantially parallel to the first and second signal lines, and the first shield line is adjacent to the first signal line.

30. The semiconductor device according to claim 22, wherein the first shield line is maintained at a fixed potential at least a period of time when the first signal line receives a coupling noise from the second signal line.

* * * * *